US012808080B2

(12) United States Patent
Bugge et al.

(10) Patent No.: US 12,808,080 B2
(45) Date of Patent: Nov. 24, 2026

(54) METHOD OF CONTROLLED n-DOPING OF GROUP III-V MATERIALS GROWN ON (111) Si

(71) Applicant: Integrated Solar AS, Trondheim (NO)

(72) Inventors: Renato Bugge, Trondheim (NO); Geir Myrvågnes, Trondheim (NO)

(73) Assignee: Integrated Solar AS, Trondheim (NO)

( * ) Notice: Subject to any disclaimer, the term of this patent is extended or adjusted under 35 U.S.C. 154(b) by 0 days.

(21) Appl. No.: 17/625,441

(22) PCT Filed: Jul. 7, 2020

(86) PCT No.: PCT/EP2020/069052
§ 371 (c)(1),
(2) Date: Jan. 7, 2022

(87) PCT Pub. No.: WO2021/005026
PCT Pub. Date: Jan. 14, 2021

(65) Prior Publication Data

US 2022/0259758 A1 Aug. 18, 2022

(30) Foreign Application Priority Data

Jul. 9, 2019 (EP) .................................... 19185186

(51) Int. Cl.
*C30B 23/02* (2006.01)
*C23C 14/06* (2006.01)
(Continued)

(52) U.S. Cl.
CPC .......... *C30B 23/02* (2013.01); *C23C 14/0617* (2013.01); *C23C 14/221* (2013.01);
(Continued)

(58) Field of Classification Search
CPC ..... C30B 23/00; C30B 23/002; C30B 23/005; C30B 23/02; C30B 23/025; C30B 25/00;
(Continued)

(56) References Cited

U.S. PATENT DOCUMENTS 4,550,031 A 10/1985 Abrokwah
4,833,101 A * 5/1989 Fujii ...................... C30B 29/40 148/DIG. 160
(Continued)

FOREIGN PATENT DOCUMENTS

CN 105428225 3/2016
CN 105428225 A 3/2016
(Continued)

OTHER PUBLICATIONS

Kawai, et al. publication entitled "Initial growth mechanism of AlAs on Si(111) by molecular beam epitaxy," Appl. Phys. Lett., vol. 59, pp. 2983-2985 (1991). (Year: 1991).*
(Continued)

*Primary Examiner* — Kenneth A Bratland, Jr.
(74) *Attorney, Agent, or Firm* — Alix, Yale & Ristas, LLP

(57) ABSTRACT

The present invention is related to a method of providing n-doped group III-V materials grown on (111) Si, and especially to a method comprising steps of growth of group III-V materials interleaved with steps of no growth, wherein both growth steps and no growth steps are subject to a constant uninterrupted arsenic flux concentration.

18 Claims, 13 Drawing Sheets

(51) Int. Cl.

| | |
|---|---|
| ***C23C 14/22*** | (2006.01) |
| ***C23C 14/54*** | (2006.01) |
| ***C30B 23/00*** | (2006.01) |
| ***C30B 29/40*** | (2006.01) |
| ***H10P 14/20*** | (2026.01) |
| ***H10P 14/22*** | (2026.01) |

(52) U.S. Cl.
CPC ............ *C23C 14/54* (2013.01); *C30B 23/005* (2013.01); *C30B 29/40* (2013.01); *H10P 14/22* (2026.01); *H10P 14/2905* (2026.01); *H10P 14/2926* (2026.01); *H10P 14/3222* (2026.01); *H10P 14/3421* (2026.01); *H10P 14/3442* (2026.01)

(58) Field of Classification Search
CPC ......... C30B 25/02; C30B 25/14; C30B 25/16; C30B 25/165; C30B 25/18; C30B 25/183; C30B 29/00; C30B 29/10; C30B 29/40; C23C 14/0617; C23C 14/221; C23C 14/54; H01L 21/02381; H01L 21/02433; H01L 21/02466; H01L 21/02546; H01L 21/02576; H01L 21/02631
USPC .................. 117/84, 88–89, 92–94, 101–103, 117/105–106, 108, 200, 204, 937, 117/953–954
See application file for complete search history.

(56) References Cited

U.S. PATENT DOCUMENTS

| | | | | |
|---|---|---|---|---|
| 5,077,875 | A * | 1/1992 | Hoke | C30B 25/02 118/725 |
| 5,268,582 | A | 12/1993 | Kopf | |
| 5,463,978 | A | 11/1995 | Larkin | |
| 5,476,811 | A * | 12/1995 | Fujii | H01L 21/02395 257/E21.123 |
| 5,580,382 | A | 12/1996 | Jackson et al. | |
| 2008/0076235 | A1 * | 3/2008 | Hudait | H01L 29/205 257/E21.127 |

FOREIGN PATENT DOCUMENTS

| | | | |
|---|---|---|---|
| EP | 2748838 | | 7/2014 |
| EP | 2748838 | B1 | 6/2019 |
| JP | 11145061 | | 5/1999 |
| JP | 11145061 | A | 5/1999 |
| RU | 2643931 | | 6/2013 |
| RU | 2643931 | C2 | 2/2018 |
| WO | 2013/026858 | | 2/2013 |

OTHER PUBLICATIONS

Chai, et al. publication entitled "The effect of growth conditions on Si incorporation in molecular beam epitaxial GaAs," Appl. Phys. Lett., vol. 39, pp. 800-803 (1981). (Year: 1981).*

Sakaki, et al. entitled "One atomic layer heterointerface fluctuations in GaAs—AlAs quantum well structures and their suppression by insertion of smoothing period in molecular beam epitaxy," Japanese Journal of Applied Physics, vol. 24, pp. L417-L420 (1985). (Year: 1985).*

Kunzel, et al. entitled "The effect of arsenic vapour species on electrical and optical properties of GaAs grown by molecular beam epitaxy," Appl. Phys. A, vol. 28, pp. 167-173 (1982). (Year: 1982).*

Kaspi, et al. publication entitled "Digital alloy growth in mixed As/Sb heterostructures," Journal of Crystal Growth, vol. 251, pp. 515-520 (2003). (Year: 2003).*

Yamamoto, et al. publication entitled "Misorientation dependence of crystal structures and electrical properties of Si-doped AlAs grown on (111)A GaAs by molecular beam epitaxy," Japanese Journal of Applied Physics, vol. 32, pp. 3346-3353 (1993). (Year: 1993).*

International Search Report issued Sep. 4, 2020 in corresponding International Search Report PCT/EP2020/069052.

Extended European Search Report issued Dec. 6, 2019 in corresponding European Patent Application No. 19185186.4.

Y.G. Chai et al., "The effect of growth conditions on Si incorporation in molecular beam epitaxial GaAs", Applied Physics Letters, vol. 39, No. 10, Nov. 15, 1981, pp. 800-803.

Saletes et al., "Effect of As4/Ga Flux Ratio on Electrical Properties of NID GaAs Layers Grown by MBE", Electronic Letters, vol. 20, No. 21, Oct. 11, 1984, pp. 872-874.

H. Kunzel et al., "The effect of Arsenic Vapour Species on Electrical and Optical Properties of GaAs Grown by Molecular Beam Epitaxy", Appl. Phys., vol. 28, pp. 167-173, 1982.

T. Kawai et al., "Initial growth mechanism of AIAs on Si(111) by molecular beam epitaxy", Applied Physics Letters, vol. 59, No. 23, Dec. 2, 1991, pp. 2983-2985.

Hiroyuki Sakaki et al., "One Atomic Layer Heterointerface Fluctuations in GaAs—AlAs Quantum Well Structures and Their Suppression by Insertion of Smoothing Period in Molecular Beam Epitaxy", Japanese Journal of Applied Physics, vol. 24, No. 6, Jun. 1985, pp. L417-L420.

Written Opinion issued Sep. 4, 2020 in corresponding International (PCT) Patent Application No. PCT/EP2020/069052.

Controllable p-type and n-type doping in InSb grown by homoepitaxy and heteroepitaxy dated May 1994.

Office Action and Search report issued in RU2022103054 Sep. 11, 2023 with English translation, submitted inter alia as a Statement of Relevance for non-English references cited therein.

Office Action and Search Report issued in CN 202080049906.6 Nov. 1, 2024 with English translation, submitted inter alia as a Statement of Relevance for non-English references cited therein.

"Controllable p-type and n-type doping in InSb grown by homoepitaxy and heteroepitaxy" China Academic Journal Electronic Publishing House (1994).

Herman, M.A. et al., "Molecular Beam Epitaxy: Fundamentals and Current Status", Springer Series in Materials Science 7, 2nd Edition Springer-Verlag Berlin Heidelberg New York, p. 359-365 (1996).

Pei, Z.J. et al., "Grinding of silicon wafers: a review from historical perspectives," International Journal of Machine Tools and Manufacture, vol. 48, No. 12-13, pp. 1297-1307 (2008).

Office Action dated Jan. 11, 2024 for Chinese Patent Application No. 202080049906.6.

Office Action and Search Report dated Nov. 9, 2023 for Russian Patent Application No. 2022103054/05.

* cited by examiner

Table 1

| Layer thickness | Composition (at%) | Growth temp. | Growth stop (sec) | As-flux | Thickne ss | n-doping ($cm^{-3}$) | Mobility ($cm^2/Vs$) |
|---|---|---|---|---|---|---|---|
| 500Å | Ga0.83In0.17As | 430 | 294 | 2,00E-05 | 1000nm | 2,80E+18 | 87 |
| 250Å | Ga0.83In0.17As | 430 | 294 | 2,00E-05 | 1000nm | 1,20E+18 | 73 |
| 500Å | Ga0.83In0.17As | 400 | 294 | 2,00E-05 | 1000nm | 2,60E+18 | 13 |
| 500Å | Ga0.83In0.17As | 375 | 294 | 2,44E-05 | 1000nm | | 0 |
| 500Å | Ga0.83In0.17As | 400 | 147 | 2,40E-05 | 1000nm | -2,00E+18 | |
| 500Å | Ga0.83In0.17As | 430 | 294 | 2,80E-05 | 1000nm | 2,70E+18 | 55 |
| 500Å | Ga0.83In0.17As | 430 | 294 | 1,03E-05 | 600nm | 7,00E+17 | 2,2 |
| 500Å | Ga0.83In0.17As | 430 | 294 | 1,25E-05 | 600nm | 1,22E+18 | 20 |
| 500Å | Al0.4Ga0.6In0.1As | 430 | 294 | 1,25E-05 | 600nm | 1,00E+16 | |
| 500Å | Ga0.83In0.17As | 500 | 294 | 2,00E-05 | 1000nm | 1,40E+18 | 80 |
| 500Å | Ga0.95In0.05As | 500 | 294 | 2,00E-05 | 1000nm | 3,50E+18 | 90 |

Summary of growth parameters, mobility and n-type carrier concentration.

Figure 5

Table 2:

| | Layer materials at% | Nominal composition at% | Doping(nominal) | Thick. (nm) Sampl.1 | Thick. (nm) Sampl.2 | Thick. (nm) Sampl.3 | Thick. (nm) Sampl.4 | Thick. (nm) Sampl.5 |
|---|---|---|---|---|---|---|---|---|
| Substrate | P-Si | | n=1E16cm-3 | 30000 | 30000 | 30000 | 30000 | 30000 |
| Substrate | n-Si | | n=1E20cm-3 | 400 | 400 | 400 | 400 | 400 |
| 1 | AlSb(1-x)As(x) | x=0 -> x=0.3 | p=1E20cm-3 | 27 | 27 | 27 | 27 | 27 |
| 2 | Ga(1-y)Al(y)As(x)Sb(1-x) | y=0.1 -> y=0.25, x=0.15+/-0.05 | p=1.2E19cm-3 ->6E18cm-3 | 30 | 30 | 30 | 30 | 15 |
| 3 | Ga(1-y)Al(y)As(x)Sb(1-x) | y=0.25 -> y=0.15, x=0.15->x=1.0 | p=1.1E19cm-3 -> 1.2E19cm-3 | 100 | 100 | 10 | | |
| 4 | Ga(1-y-z)Al(y)In(z)As(x)Sb(1-x) | y=0.54, z=0.025, x=0.15->x=0.5 | p=1.1E19cm-3 -> 1.0E19cm-3 | | | 120 | 24 | 24 |
| 5 | Ga(1-y-z)Al(y)In(z)As(x) | y=0.42, z=0.006 | p=1.1E19cm-3 -> 1.0E19cm-3 | 150 | 150 | | | |
| 6 | Ga(1-y-z)Al(y)In(z)As(x)Sb(1-x) | y=0.54, z=0.025, x=0.5->x=1.0 | p=1.0E19cm-3 -> 4.4E18cm-3 | | | 40 | 96 | 72 |
| 7 | Ga(1-y-z)Al(y)In(z)As | y=0.25, z=0.05 | p=2.0E18cm-3 | 10 | 10 | 10 | 100 | |
| 7 | Ga(1-y-z)Al(y)In(z)As | y=0.15, z=0.05 | p=2.0E18cm-3 | | | 100 | | 100 |
| 8 | Ga(1-y-z)Al(y)In(z)As | y=0.25, z=0.05 | unintentional p-doped | 1000 | 1000 | 900 | 800 | |
| 9 | Ga(1-y-z)Al(y)In(z)As | y=0.15, z=0.05 | -> p=5.0E16cm-3 | | | | | 600 |
| 10 | Ga(1-y-z)Al(y)In(z)As | as previous layer | n=1.0E17cm-3 | 100 | 100 | 100 | 100 | 200 |
| 11 | Ga(1-y-z)Al(y)In(z)As | as previous layer | n=1.0E17cm-3 -> n=1.0E18cm-3 | 70 | 70 | 70 | 70 | 70 |
| 12 | Ga(1-y-z)Al(y)In(z)As | y=0.44, z=0.0125 | n=1.0E18cm-3 (approximate) | 40 | 40 | 40 | 40 | 40 |
| 13 | Ga(1-z)In(z)As | z=0.067 | n>2.0E18cm-3 | 100 | 100 | 100 | 100 | |
| 14 | Ga(1-z)In(z)As | z=0.13 | n>2.0E18cm-3 | | | | | 100 |

Figure 11A

Table 2 continued:

| | |
|---|---|
| Layer 1: | Wetting layer and P-junction |
| Layer 2: | Flattening layer |
| Layer 3: | Extended flattening layer |
| Layer 4: | Grading layer |
| Layer 5: | Thicker window p-type |
| Layer 6: | Window p-type |
| Layer 7: | Base p-type |
| Layer 8: | Base p-type |
| Layer 9: | Base p-type |
| Layer 10: | Base n-type |
| Layer 11: | Emitter n-type |
| Layer 12: | Window n-type |
| Layer 13: | Contact layer |
| Layer 14: | Contact layer with more In |

Layer 1 is on top of the Si substrate followed by layer 2 etc. The table illustrates fivr different samples in the columns. The respective layers are on the rows. When the composition is different in layers, separate rows are listed.

Figure 11B

METHOD OF CONTROLLED n-DOPING OF GROUP III-V MATERIALS GROWN ON (111) Si

A method of controlled n-doping of group III-V materials grown on (111) Si.

TECHNICAL FIELD

The present invention is related to a method of providing n-doped group III-V materials grown on (111) Si, and especially to a method comprising steps of growing group III-V materials interleaved with steps of no growth, wherein both growth steps and no growth steps are subject to a constant uninterrupted arsenic flux concentration.

BACKGROUND

An intrinsic semiconductor material needs normally dopants to form an extrinsic semiconductor like an n-type semiconductor, i.e. a material wherein the electrons are the majority carriers and holes are the minority carries. A p-type semiconductor comprises a semiconductor material wherein the holes are the majority carriers and the electrons are the minority carriers. Intrinsic semiconductor material doping usually comprises introducing impurity atoms into the intrinsic semiconductor. The impurity atoms are from elements being different from the semiconductor material and impurity atoms are either donors or acceptors to the intrinsic semiconductor. Donors donate their extra valence atoms to the semiconductor's conduction bands. Acceptors accepts electrons from the semiconductors valence band thereby providing excessive holes in the intrinsic semiconductor material i.e. providing a p-type semiconductor. When making semiconductor devices, an n-type and a p-type semiconductor may be joined forming for example a p-n junction.

However, it is known that semiconductor materials may exhibit non-intentional doping of for example p-type or n-type when manufactured in a molecular beam epitaxy growth process. The reason may be imperfect structural quality of the resulting semiconductor material (crystal defects etc.). In such circumstances, it may not be possible to use dopants to make an n-type or p-type semiconductor if a non-intentional p- or n-doping has occurred (sometimes denoted self-doping, i.e. an added dopant agent is not used) in the semiconductor material. If for example a non-intentional P-doping (or self-doping) has occurred in the epitaxial growth process it is known that adding a n-doping agent in a process called compensation doping is possible when making the material n-doped. However, this possibility usually depends at least on the level of p-doping present in the material if a compensation n-doping can be successful.

GaAs is most commonly doped with silicon in order to make it n-type, but can in addition be doped with germanium, sulfur, tellurium or tin, or beryllium, chromium or germanium etc. in order to make it n- or p-doped respectively. One type of dopant can in fact act as both an n-dopant and a p-dopant, depending on which location it takes in the GaAs lattice. For GaAs, this is relevant for all members of the carbon group, which will be an n-dopant if occupying an As-location, while they will be a p-dopant if they occupy a Ga-location. Notation wise, a Ga-atom occupying a Ga-location in the GaAs-lattice is denoted $Ga_{Ga}$, while a Ga occupying an As-location is denoted GaAs and so on.

The di-atomic nature of GaAs makes it a highly challenging material when making controllable doping. A non-unity ratio between the two constituents Ga and As will for example provide a strong doping effect in the material, as a GaAs will act as a p-dopant and $As_{Ga}$ will act as an n-dopant. Consequently, a slightly higher concentration of Ga during the formation of GaAs will lead to a p-type material, while the opposite will lead to an n-type material.

The inevitable introduction of mono-vacancies and dopant-vacancy complexes ads further to the complexity when controlling doping of GaAs. Both As-vacancies ($V_{As}$) and gallium vacancies ($V_{Ga}$) have been reported to act as a p-dopants (refer Lombos, et al., "Vacancy Doping of GaAs." physica status solidi (a), Volume 96, Issue 2 (16 Aug. 1986) pp. 663-675), while dopant-vacancy complexes, such as $Si_{Ga}$ $V_{Ga}$, have been found to compensate for n-doping by acting as an acceptor, despite Si generally is acting as n-dopant in GaAs. The compensation of n-doping by $Si_{Ga}$ $V_{Ga}$ has been shown to be strongest for high Si-doping, in which case Si atoms additionally adds to the compensation effect through acting as an amphoteric dopant $Si_{As}$.

The balancing of the Ga/As-ratio is particularly challenging during thin film deposition of GaAs, using for example molecular beam epitaxy (MBE). During MBE deposition of GaAs, the As is deposited as a mixture between As, $As_2$ and $As_4$, all having different chemisorptive properties. $As_2$ and $As_4$ for example, adhere differently to GaAs, depending i.e. on temperature and the concentration of Ga on the GaAs surface. The maximum sticking coefficient of $As_2$ and $As_4$ onto GaAs is reported as measuring 0.75 and 0.5 respectively. When depositing GaAs using MBE, maintaining a higher vapour pressure (flux) of As than for Ga is used to obtain a unity ratio between the two elements. A higher incorporation of Ga than As into a thin film, will thus lead to a p-doped thin film.

[1] T. Yamamoto, M. Inai, A. Shinoda, T. Takebe discloses in the article "Misorientation Dependence of Crystal Structures and Electrical Properties of Si-Doped AlAs Grown on (111)GaAs by Molecular Beam Epitaxy", Japanese Journal of Applied Physics Vol 32, pp. 3346 (1993) how miss-orientation of (111)GaAs influence doping efficiency. The efficiency of Si-doped AlAs layers on miss-oriented (111)GaAs was reduced when the miss-orientation was less than 3 degrees, providing a high electrical resistance at (111) on-axis growth.

[2] T. Kawai, H. Yonezu, Y. Yamauchi, Y. Takano, and K. Pak disclose in the article "Initial growth mechanism of AlAs on Si(111) by molecular beam epitaxy", Physics Letters 59, pp. 2983 (1991) that $As_4$ can be used to grow un-faceted AlAs and GaAs on Si. However, the effect of $As_4$ on-doping was never investigated.

[3] K. Winer, M. Kawashima, and Y. Horikoshi disclose in the article "Si doping efficiency in GaAs grown at low temperatures", Applied Physics Letters 58, pp. 2818 (1991) the effect of doping using different $Ga/As_4$ flux ratios. The doping was dependent on the $Ga/As_4$ flux ratio.

[4] A. Saletes, J. Massies, G. Neu, J. P. Contour: "Effect of $As_4$/Ga flux ratio on electrical properties of NID GaAs layers grown by MBE", Electronic Letters, Vol. 20, No. 21 (1984) disclose how a III/V flux ratio could be used to control the type and level of doping in GaAs films grown on Si(100) surfaces without adding any separate doping material. This effect is denoted as non-intentional doping (NID) as the material exhibit a tendency of variable levels of self-doping by controlling the parameters of growth in the molecular beam epitaxy system.

If the material becomes a non-intentional p-doped material compensation doping with for example Si may not always result in a n-doped material, i.e. compensating for the non-intentional p-doping. Especially, compensation doping can be impossible if the p-doping concentration is too high.

Therefore, the present invention comprises a method of epitaxial growth in an MBE (Molecular Beam Epitaxy) machine providing a control of non-intentional doping, which in view of the purpose of the present invention is to enable compensation n-doping of the material resulting in a n-type material.

When growing GaAs on silicon it is known that non-intentional doping may occur. Therefore, it is a need of an improved method of controlled doping of III-V materials on (111)Si. Especially, it is a need of improved growing an n-type semiconductor comprising at least GaAs on (111) Si in a Molecular Beam Epitaxy growth process.

Object of the Invention

In particular, it may be seen as an object of the present invention to provide a n-type doped semiconductor comprising at least GaAs on Si(111) by a continuous flowing As flux concentration on the Si(111) growth interface in a Molecular Beam Epitaxy (MBE) growth process.

It is a further object of the present invention to provide an alternative to the prior art.

SUMMARY

Thus, the above described object and several other objects are intended to be obtained in a first aspect of the invention by providing a method of controllable n-doping in a molecular beam epitaxy (MBE) growth process comprising growing group III-V materials on a (111)Si substrate, wherein a nucleation layer comprises group III-Sb material(s), the method comprises steps of:

- growing the nucleation layer, thereafter
- directing a continually flowing arsenic flux towards the growth interface of the (111)Si substrate,
- depositing group III-V material(s) in steps comprising periods wherein in a first step the deposition of the group III-V material(s) is carried out, followed by a second step wherein the deposition of the group III-V material(s) is stopped,
- continuing depositing the group III-V material(s) according to the first step and the second step while the arsenic flux is continually flowing until the final material composition is grown,
- keeping the temperature of the epitaxial growth process in an interval between 300° C. to 580° C.,
- wherein the deposited material is non-intentionally doped with a resulting p-type doping concentration in an interval of 2E14 $cm^{-3}$ to 3.6E16 $cm^{-3}$, and with a mobility ≥1.6E3 $cm^2/Vs$ at room temperature enabling compensation doping with a n-doping agent.

Respective aspects of the present invention may each be combined with any of the other aspects. These and other aspects of the invention will be apparent from and elucidated with reference to the embodiments described hereinafter.

FIGURES

The method of controlled n-doping of the present invention will now be described in more detail with reference to the accompanying figures. The figures illustrate examples of embodiments of the present invention and is not to be construed as being limiting to other possible embodiments falling within the scope of the attached claim set. Further, respective examples of embodiments may each be combined with any of the other examples of embodiments.

FIG. 1*a* illustrates an example of a perfect GaAs crystal.

FIG. 1*b* illustrates an example of a GaAs crystal missing an arsenic atom.

FIG. 2 illustrates schematically an example of a growth process of the present invention.

FIG. 3*a* illustrates an example of mobility measurements in an example of embodiment of the present invention.

FIG. 3*b* illustrates an example of carrier density measurements in an example of embodiment of the present invention.

FIG. 5 illustrates examples of parameter settings of the growth process and obtained results.

Figure 6A:
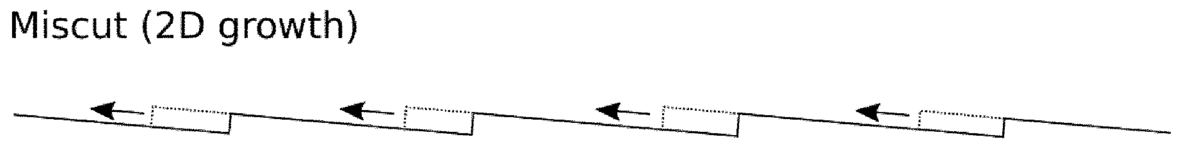

FIG. 6*a* illustrates 2D growth on a miscut (111) Si substrate surface.

Figure 6B:
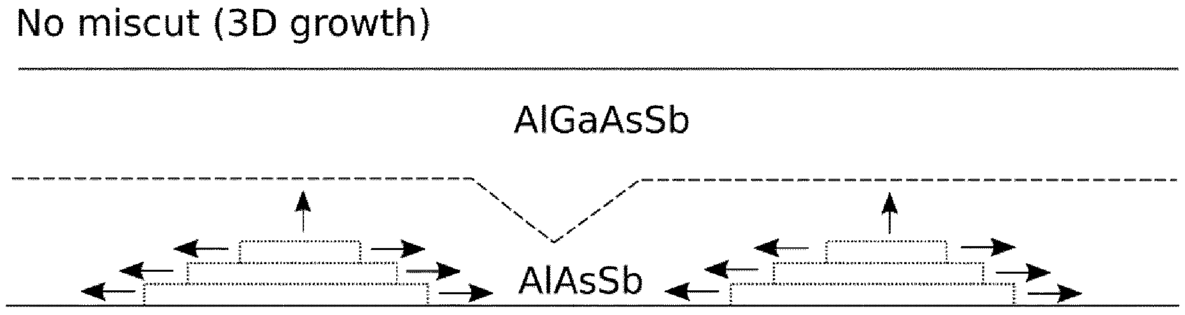

FIG. 6*b* illustrates 3D growth on a no miscut (111) Si substrate surface.

Figure 7:
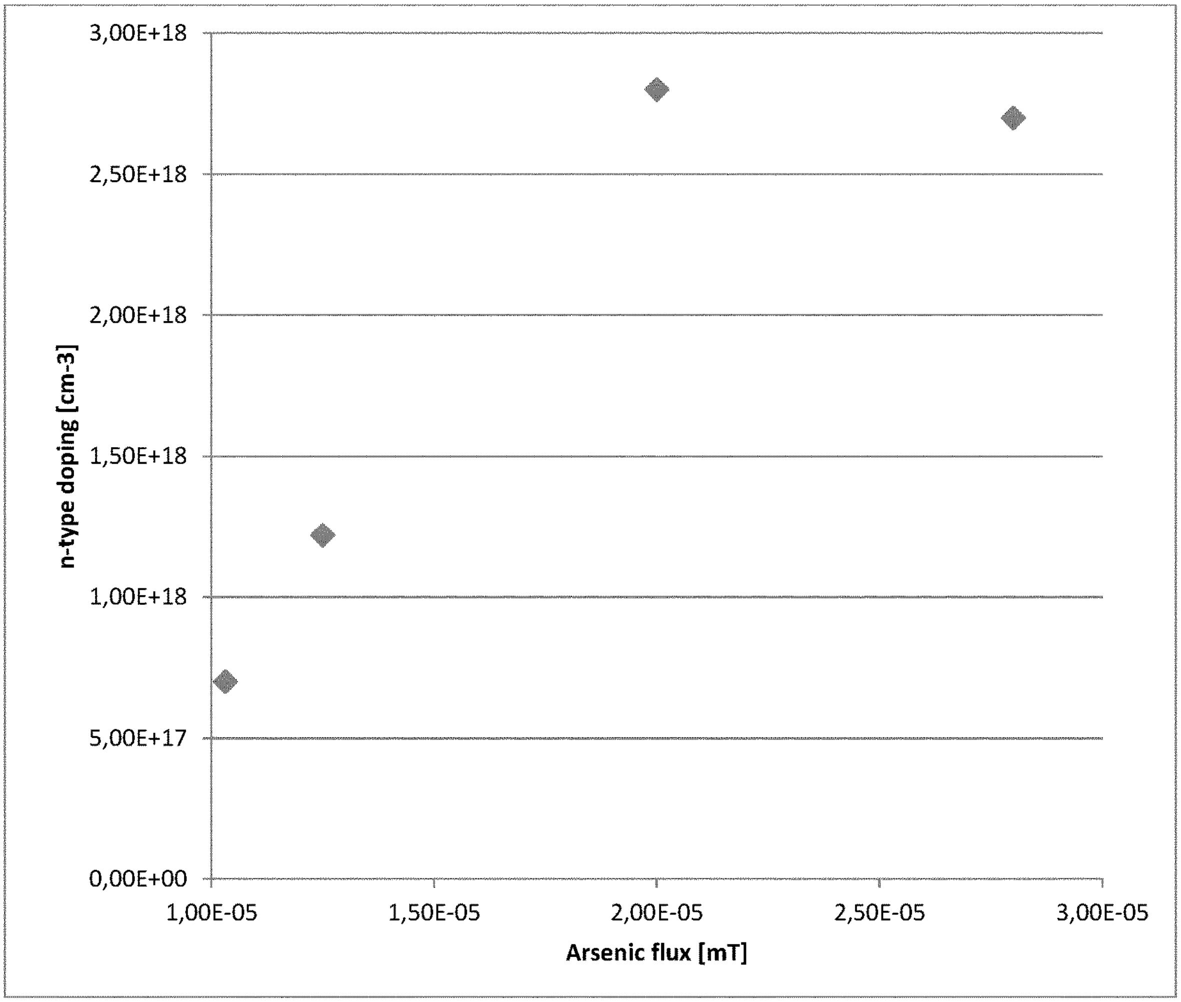

FIG. 7 illustrates results obtained in an example of embodiment of the present invention.

Figure 8:
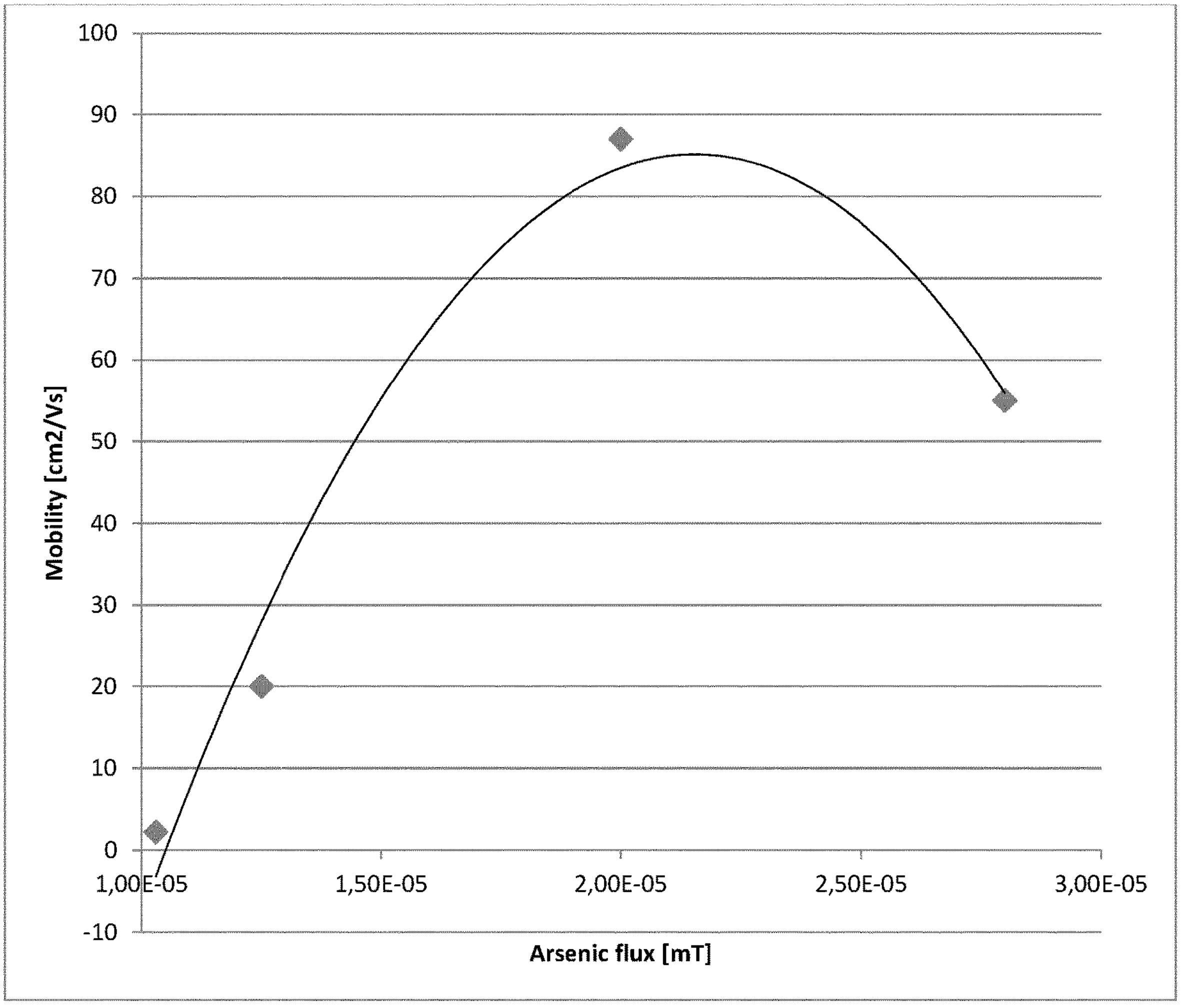

FIG. 8 illustrates further results obtained in an example of embodiment of the present invention.

Figure 9:
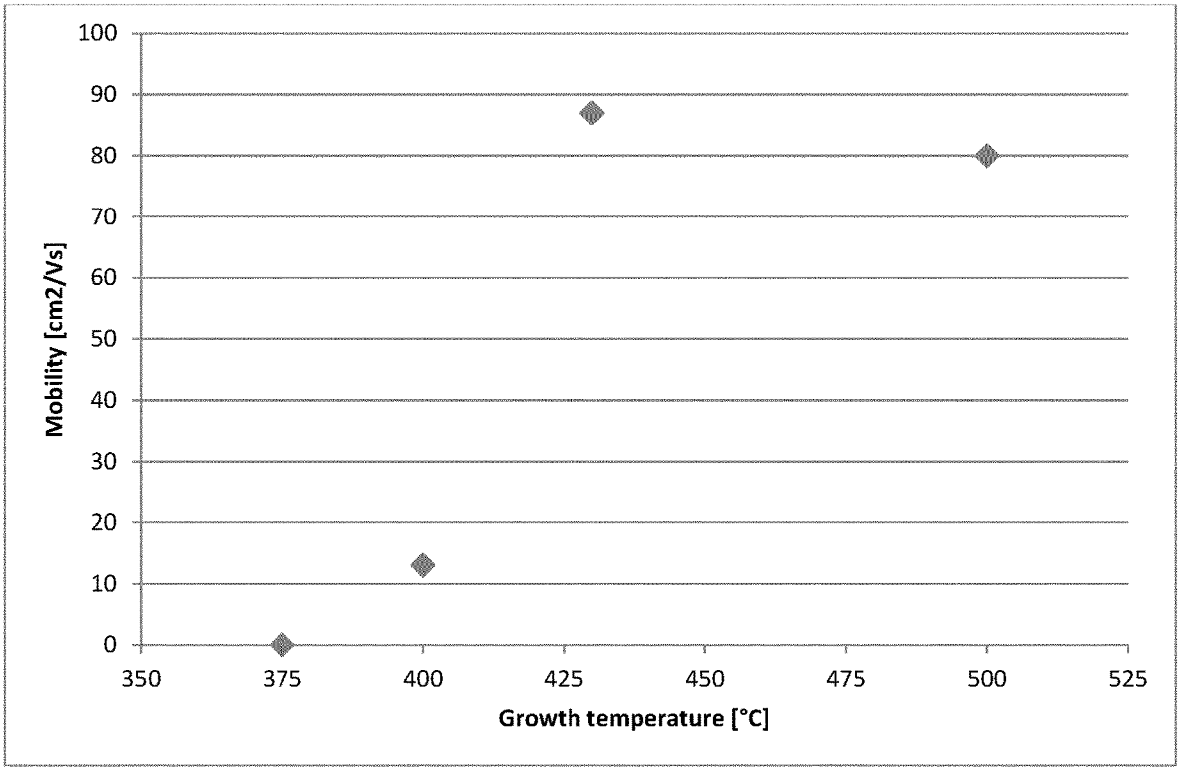

FIG. 9 illustrates further results obtained in an example of embodiment of the present invention.

Figure 10:
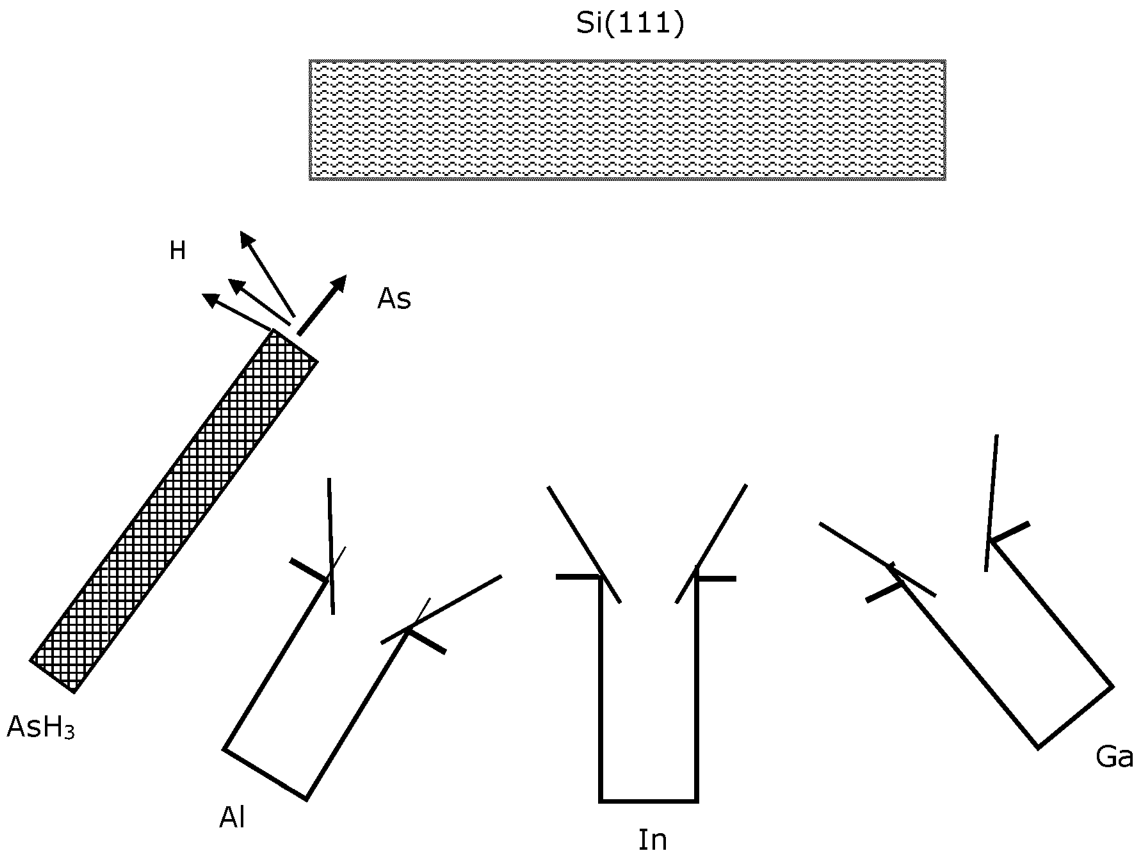

FIG. 10 illustrates an example of growing n-doped material in an MBE (Molecular Beam Epitaxy) machine according to an example of embodiment of the present invention.

FIG. 11*a* and FIG. 11*b* disclose different examples of layer structures of examples of embodiments of the present invention.

DETAILED DESCRIPTION

Although the present invention has been described in connection with the specified embodiments, it should not be construed as being in any way limited to the present examples. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference sign in the claims with respect to elements indicated in the figures shall also not be construed as limiting to the scope of the invention. Furthermore, individual features mentioned in different claims, may possibly be advantageously combined, and the mentioning of these features in different claims does not exclude that a combination of features is not possible and advantageous.

Figure 1A:
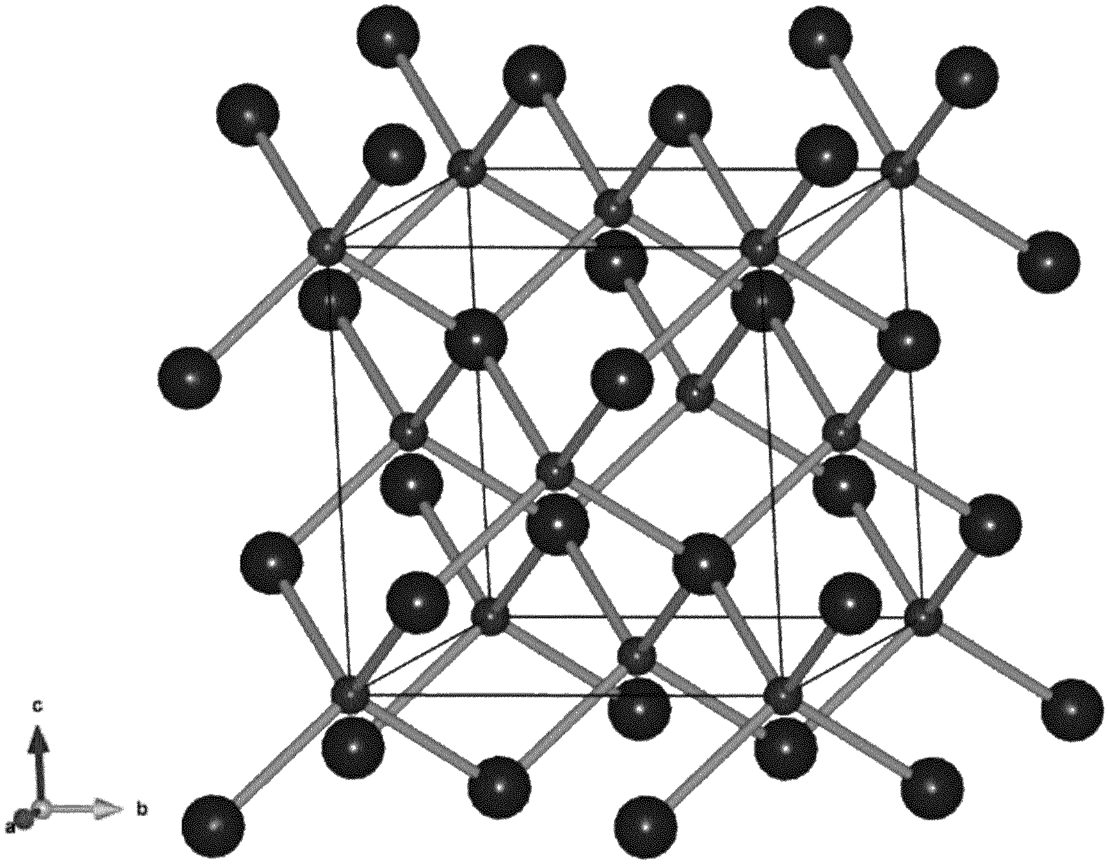

FIG. 1*a* illustrate a perfect GaAs crystal comprising Ga atoms and As atoms, wherein the respective atoms are bonded together forming the crystal structure.

Figure 1B:
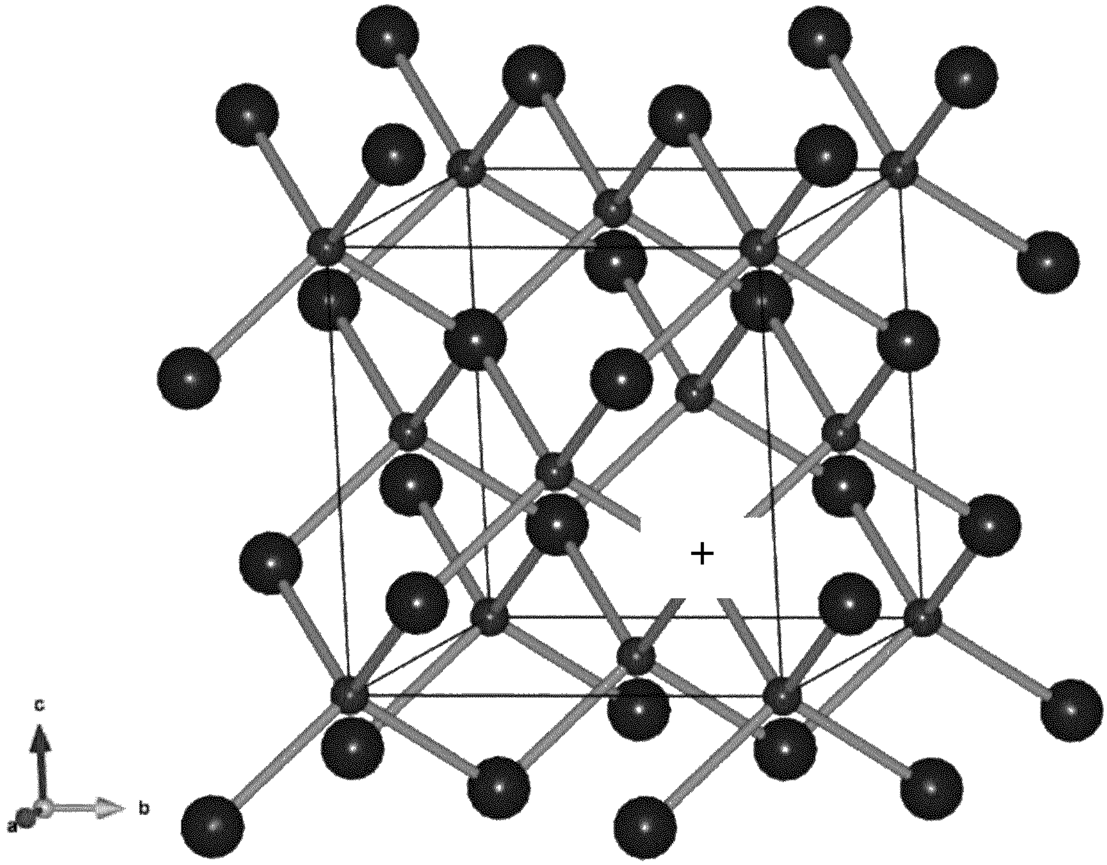

FIG. 1*b* illustrate a situation wherein an arsenic atom is missing in the crystal structure. Generally, this situation is an example of an non-intentional p-type doping in an III-V material structure. The missing arsenic atom constitutes dangling bonds from neighbouring gallium atoms. These dangling bonds can act as electron donors resulting in a localized positive charge. Movement of these charges throughout the crystal is a p-type conduction.

Figure 2:
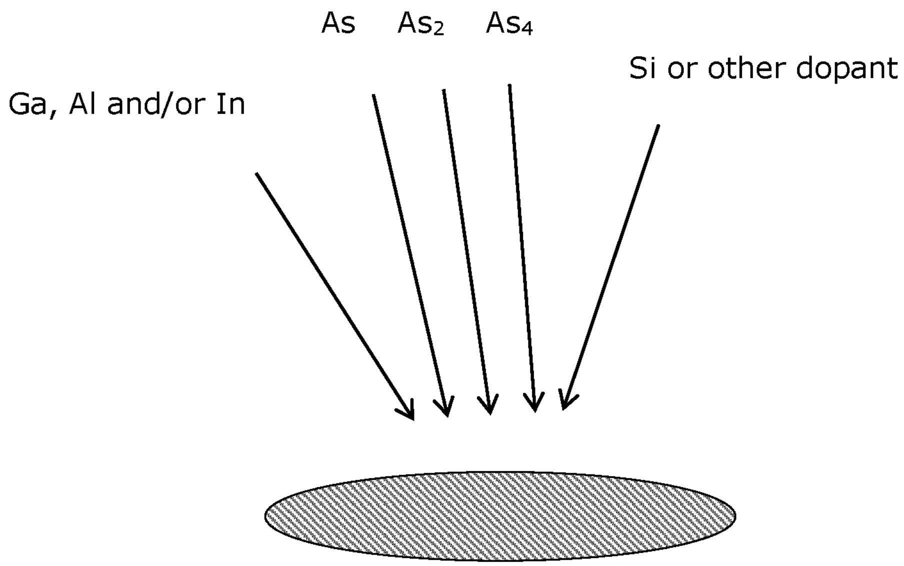

FIG. 2 illustrates a schematic view of an example of applying a flux concentration during epitaxial growth on a substrate. As known in prior art, beams comprising atoms of respective materials with a defined flux concentration may be directed towards a substrate under a given temperature.

Atoms comprised in the respective beams are then deposited onto a surface of the substrate and are bounded to atoms on the substrate surface. Shutting on and off respective beams, varying the flux concentration, temperature and pressure and other parameters, several layers may be added onto the growth interface, which may comprise different material compositions. In this manner, it is possible to design a semiconductor material with specific properties as known in prior art.

With respect to the discussion regarding FIG. 1*b*, an aspect of the present invention is the principal idea of having a high flux concentration of arsenic atoms thereby filling in arsenic vacancies in the crystal and then use for example Si as an n-dopant in the process. FIG. 2 illustrates the use of an arsenic flux concentration composed of a mixture of $As_2$, $As_4$, and Si as the n-dopant material.

However, it I also necessary to take into consideration other factors characterizing a produced semiconductor material. For example, excess arsenic may result in defects in the crystal affecting electrical properties of the semiconductor material as known to a person skilled in the art.

A specific consideration is to achieve sufficient mobility of charges in the crystal as well as sufficient charge density in the semiconductor material. Conductivity is proportional to the product of mobility and carrier concentrations. For example, the same conductivity could come from a smaller number of electrons with higher mobility for each, or a larger number of electrons with a smaller mobility for each. In semiconductors, the behavior of for example transistors and other devices can be very different depending on whether there is many electrons with lower mobility or fewer electrons with higher mobility.

Therefore, mobility is an important parameter regarding semiconductor materials. Usually, higher mobility leads to better device performance, when other features or parameters of a device is approximately the same.

Figure 3A:
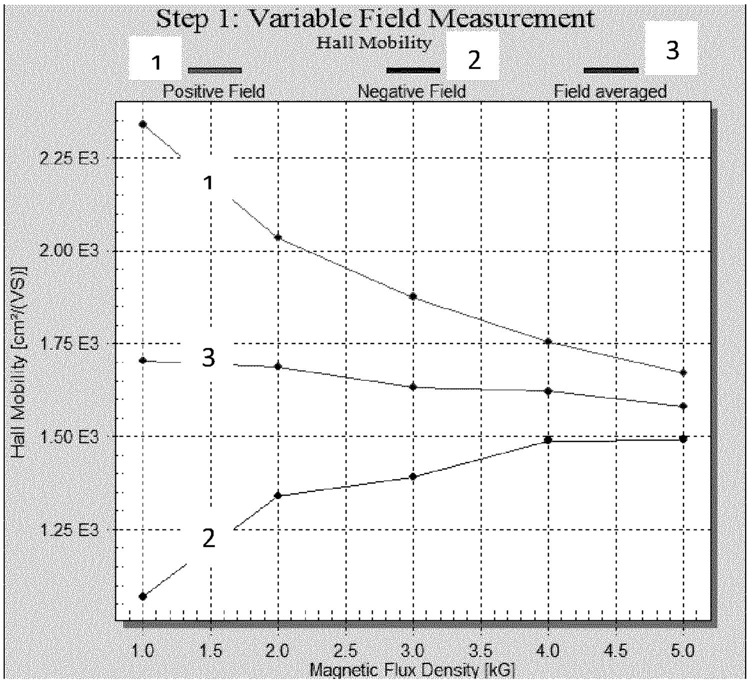
Figure 3B:
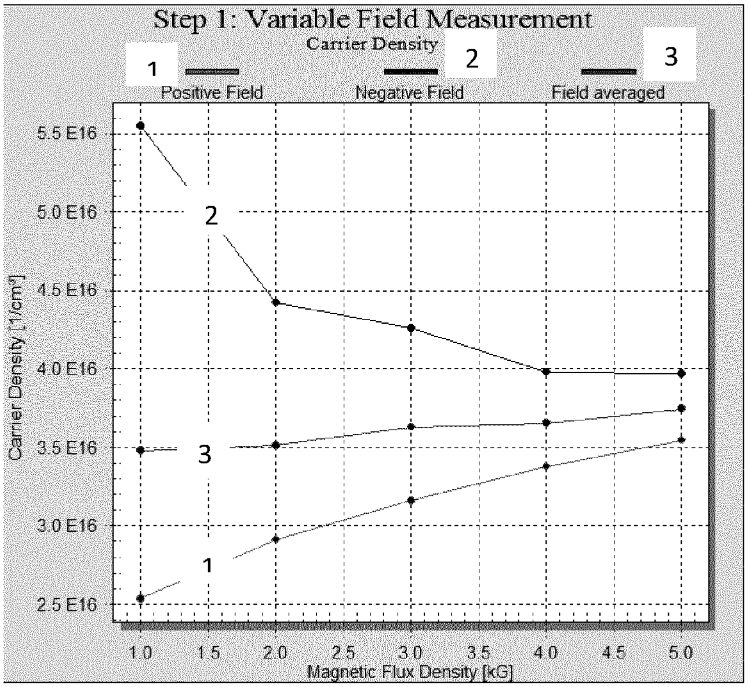

FIG. 3*a* and FIG. 3*b* illustrates an example of measurement of electrical mobility in an example of a non-intentionally doped sample of an III-V semiconductor material. FIG. 3*a* disclose Hall mobility, which disclose electrical field dependencies as a function of magnetic flux density on the mobility of electrical charges in the material. FIG. 3*b* illustrates carrier (electric charge concentration) as a function of magnetic flux density. The conductivity of the material is proportional to the product of mobility and carrier concentration as discussed above. The curves indicate an intrinsic or p-type carrier concentration around 3.5-3.6 E16 $cm^{-3}$ and mobility of around 1.6-1.7 E3 $cm^2/Vs$ at room temperature.

Therefore, a main principle behind the present invention is to avoid for example missing arsenic atoms in an III-V semiconductor material by increasing arsenic atom flux concentration when growing the III-V semiconductor material and using for example Si as n-dopant agent when providing an n-type group III-V semiconductor.

The arsenic source applied in an example of method according to the present invention, can be a solid As source with a cracker. The arsenic flux concentration is a mixture of $As_4$ and $As_2$.

When developing and testing some examples of material samples according to the present invention, the inventors used an "Arsenic Valved Cracker Mark V 500cc" supplied by the company Veeco for the arsenic flux generation. Factory recommended settings were used and the cracker provided an $As_2/As_4$ flux ratio during the growth process resulting in n-type doped materials, when using specific dopant (Si dopant) and substrate temperatures, even at very high total arsenic flux concentrations (up to and possibly above 3E-5 T). The ratio between $As_4$ and $As_2$ is controllable by setting the temperature of the cracker, for example inside an interval of 600° C. to 900° C. The concentration of $As_4$ is larger than the concentration of $As_2$ when the cracker temperature approaches 600° C., while the concentration of $As_4$ is less than the concentration of $As_2$ when the cracker temperature approaches 900° C.

The arsenic flux ratio is controllable as indicated above and dependent on the arsenic source setting. Under conditions that are not favourable, the resulting material seems always to be a highly p-type semiconductor (>1E18 $cm^{-3}$), thus n-type compensation doping becomes almost impossible to achieve as the non-intentional p-type doping will dominate the material. Measurements done by the inventors of n-doped materials with up to 5E19 $cm^{-3}$ intentionally n-type doping (calibrated on (100) GaAs) disclose that the material is still p-type under unfavourable conditions.

In an example of embodiment of the present invention, the growth process on (111) Si involves using a mixture of different arsenic flux compositions, including but not limited to $As_2$ and $As_4$ molecules. During growth, other materials is added constituting a full III-V material structure with n-doping. These materials include (but not limited to) gallium, aluminium, indium, arsenic, and n-doping (silicon), with the optional addition of antimony. In the III-V structure, silicon constitutes the dopant agent, but can be exchanged with other n-dopant agents. Growth stops may be done at certain intervals under arsenic flux concentration to increase the arsenic content of the semiconductor.

Figure 4:
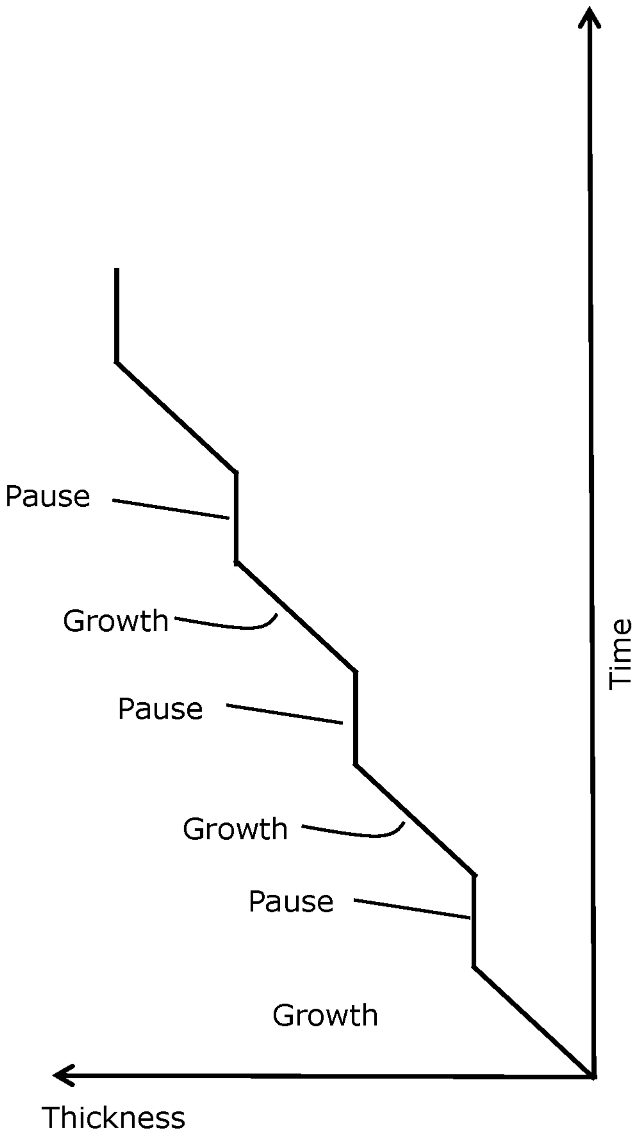
FIG. 4 illustrates examples of process steps in an example of embodiment of the present invention.

FIG. 4 illustrates an example of a growth process over time. The illustrated process starts with depositing a certain amount of selected materials as disclosed for example in FIG. 1 onto a substrate. In this example, a constant arsenic flux composition is applied during a whole growth process while the deposition of selected III-V materials or material compositions continues in steps with periods of non-growth while the arsenic flux concentration is still flowing. The thickness of the material increases in respective steps comprising growth.

In an example of embodiment of the present invention, the periods with growth stops and the periods with growth is interchangeable periodically.

In another example of embodiment of the present invention, the periods of growth stops appear at randomised irregular intervals.

In another example of embodiment of the present invention, increasing the As flux concentration may reduce the length of respective growth stops.

The periods with growth stops may be between 20 to 500 seconds long.

FIG. 5 depicts a Table 1 disclosing some examples of different parameter settings that can be used in disclosed examples of embodiments above.

Results of III-V growth, with examples of process parameters and growth stop intervals is provided in table 1 of FIG. 5. One of the examples, $Ga_{0.95}In_{0.05}As$, provides n-doping of 3.5E18 $cm^{-3}$ with a mobility of 90 $cm^2/Vs$, and another of the examples, $Ga_{0.83}In_{0.17}As$, provides n-doping of 2.80E+18 $cm^{-3}$ with a mobility of 87 $cm^2/Vs$.

When investigating the structural quality of a material processed as discussed above, the structural quality may possibly be improved. When consulting prior art with respect to (111) GaAs, the prior art suggests that the optimum growth temperature should be around 670° C. This may not be possible on (111) Si when a nucleation layer requires a high level of Sb, which is not possible to grow above 580° C. The inventors have identified that Sb is a preferable part of the nucleation layer when growing III-V materials on a (111) Si substrate.

Further, annealing at a too high temperature is also not advisable when obtaining a high structural quality since Sb-diffusion will remove Sb from the nucleation layer and produce voids or defects in the III-V material.

As discussed above, doping may cause defects in the III-V structure that can act as acceptors or donors, and non-intentional doping is the result. Controlling the defect and/or doping level of III-V materials is therefore advantageous when exploiting these structures for different applications.

Using n-type doping is important for a number of applications using III-V materials grown on (111) Si. These applications include Solar cells, Photodetectors, Semiconductor lasers and High electron mobility transistors (HEMT), for example.

A process of n-doping of III-V materials grown on (111) Si is discussed in prior art. For example, [2] T. Kawai on (111) Si has shown that $As_4$ can be used to successfully grow un-faceted AlAs and GaAs on silicon, but the effect of $As_4$ on-doping was never examined. Doping of GaAs on GaAs (100) substrates has been examined by K. Winer et al [3] using different $As_4$ and Ga fluxes, and was shown to be dependent on the Ga/$As_4$ flux ratio. Yamamoto et al [1] examined Si-doped AlAs layers on miss-oriented (111) GaAs and found that doping efficiency was reduced when miss-orientation was less than 3 deg C., with high electrical resistance at (111) on-axis growth.

A growth process on (111) Si of the present invention, involves using examples of a mixture of different arsenic flux compositions, including but not limited to monoatomic arsenic, $As_2$ and $As_4$ molecules. During growth, other materials are added constituting a full III-V material structure with n-doping. These materials include (but not limited to) gallium, aluminium, indium, arsenic, and n-doping (silicon), with the optional addition of antimony. In the III-V structure, silicon constitutes the n-dopant agent, but can be exchanged for other n-dopant agents.

According to an example of embodiment of the present invention, regular or irregular growth stops, which may be randomised, are introduced at certain intervals under arsenic flux thereby increasing the arsenic content of the semiconductor material.

Results obtained with a method of the present invention provides a non-intentional doped III-V material on (111) Si substrates with an intrinsic p-doping in an interval of 2E14 $cm^{-3}$ to 3.6E16 $cm^{-3}$. This is a good starting point when providing controlled n-type doping of these materials, wherein n-dopant compensation doping is possible due the lower level of non-intentional p-doping and is resulting in a net n-type doping of the material. A further interesting aspect is that n-type doping of examples of material compositions grown according to the present invention may provide lower mobility, but this does not result in an ohmic resistance of the material that is too high.

Further, annealing at a too high temperature may not provide a high structural quality since Sb-diffusion will remove Sb from the nucleation layer and produce voids or defects in the III-V material. The growth temperature should not exceed 580° C. when applying Sb.

Another aspect of growing group III-V materials, when the resulting semiconductor is to be used in a solar cell (and also in other applications), is that the surface of the semiconductor should be flat. Avoiding for example crystal faceting is possible by adding Indium to the group III-V materials used in the growth process according to the present invention. A preferred at % amount of indium is from an interval of 1.1 at % to 21.4 at %. More specifically, In is selected from a group of amounts comprising 1.1 at %, 1.2 at %, 1.4 at %, 2.2 at %, 2.4 at %, 2.6 at %, 2.9 at %, 3.3 at %, 3.9 at %, 4.2 at %, 4.6 at %, 5.6 at %, 7.1 at %, 8.3 at %, 10.0 at %, 14.3 at %, 16.7 at % or 21.4 at %. This has shown to reduces defects in the resulting material.

Non-intentionally p-doped samples after post-growth annealing is known to be caused by defects in the III-V structure that act as acceptors or donors, and non-intentional p-doping is the result. Controlling the defects and/or doping levels of III-V materials is therefore advantageous when exploiting these structures for different applications.

Another consideration regarding MBE growth is growing an on-cut (111) Si crystal versus a miscut crystal. In examples of embodiments of the present invention an on-cut crystal is preferred preventing presence of steps on the silicon surface, refer FIG. 6*a*. Such steps in the surface will be either one monolayer or several monolayers in height. In the case of the latter, these steps can lead to defects in the grown crystal. For on-cut crystals, the lack of steps leads to 3D-like growth on the surface, refer FIG. 6*b*. For example, when the starting growth of a nucleation layer AlAsSb on top of the (111) Si surface, this will show up as islands on the surface. These islands will eventually grow in size until they meet, and as such will cover the whole surface. Once such covering has been achieved, the growth is shifted towards growth with gallium containing materials. The gallium helps in reducing the 3D-like growth towards achieving a flat growth surface and hence reduction of defects. Refer also the flattening layers 2 and 3 disclosed in Table 2 in FIG. 11*a*.

Another aspect of the present invention is to avoid non-intentional n-doping of the nucleation layer. Therefore, a nucleation layer is grown separately, while III-V material deposition should be n-doped in higher layers above the nucleation layer.

It is further within the scope of the present invention using a technique denoted “digital alloy growth”. This implies using thinner AlInAs layers and thinner GaLnAs layers, which results in layers with higher Al content. An effect of this approach is that GaInAs layers may be doped without doping the AlInAs layers. Refer the article “Digital alloy growth in mixed As/Sb hetero-structures” by Ron Kaspi et. Al. Journal of Crystal Growth, volume 251, Issues 1-4, April 2003, pages 515-520.

Using n-type doping is important for a number of applications when using III-V materials grown directly on (111) Si. These applications include solar cells, photodetectors, semiconductor lasers and high electron mobility transistors (HEMT). Refer Table 2 in FIG. 11*a* and FIG. 11*b* disclosing a solar cell structure comprising examples of layers according to the present invention.

FIG. 7 illustrate examples of achieved results of n-type doping in an example of embodiment of the present invention. The n-type doping concentration in n-type $Ga_{0.83}In_{0.17}As$ as a function of arsenic flux is illustrated. The material is grown at a temperature of 430° C., with 50 nm intervals and 294 seconds growth stops in between respective intervals. arsenic flux is always present (applied), while gallium and indium flux are only present (applied) during growth intervals. Refer also Table 1 of FIG. 5 disclosing achieved mobility and n-doping concentration with different As-flux concentration etc.

FIG. 8 illustrates achieved examples of electron mobility in n-type $Ga_{0.83}In_{0.17}As$ as a function of arsenic flux. The material is grown at a temperature of 430° C., with 50 nm thickness intervals and 294 seconds growth stop in between respective intervals. Arsenic flux is always present, while gallium and indium flux are only present during growth intervals. When there are relative low flux rates, the mobility is low due to reduced arsenic content (as seen in FIG. 7), at relative intermediate flux rates the mobility is in the range 80-90 $cm^2/Vs$, while at relative high flux rates the mobility is reduced again. Comparing with FIG. 7, the carrier concentration at high flux rates is not reduced. Thereby, the reduction of mobility is due to defects related to excess arsenic, which does not affect the carrier concentration.

There is a relationship between the duration of a growth stop and the As flux concentration. If the As flux concentration is higher, the growth stop duration can be shorter. In this manner it is possible to manipulate As flux concentration versus growth stop durations.

In principle there is no harm done if the growth stop duration is too long. However, impurities inside the MBE chamber has a tendency to be captured by the material sample if the duration of the epitaxial growth is long. This is a well-known problem that impurities in the MBE machine itself can induce defects in the resulting material structure, and hence cause non-intentional doping. Therefore, shorter growth stops with higher As flux concentrations is preferable. Refer for example FIG. 7.

FIG. 9 illustrate achieved examples of electron mobility in n-type $Ga_{0.83}In_{0.17}As$ as a function of growth temperature. The material is grown with an arsenic flux of 2.0E-5 Torr, with 50 nm intervals and 294 seconds growth stops in between intervals. Arsenic flux is always present, while gallium and indium flux are only present during growth intervals. For the example of sample grown at 375° C., a proper measurement was not possible due to the high resistivity of that sample. This suggests a low mobility value and/or low carrier concentration, which is shown in the above plot as a point at 0 $cm^2/Vs$. At 430° C. the mobility reaches a higher value (87 $cm^2/Vs$) and provides no considerable reduction at 500° C. With reference to table 1 in FIG. 5, the carrier concentration is lower at 500° C. for $Ga_{0.83}In_{0.17}As$. The same table 1 suggests that the reduction of the carrier concentration can be counteracted and even increased. Lowering of the indium content when growing at these temperatures provides these effects.

FIG. 10 illustrates an example of a set up when manufacturing material samples according to the present invention.

Respective material sources can be solid sources or a combination of solid sources and gas sources. Such machines can utilize CVD (Chemical Vapour Deposition) deposition, or MOCVD (Metal Organic Chemical Vapour Deposition) as known in prior art.

FIG. 11*a* disclose examples of material compositions of respective layers of five different material samples of a solar cell design. FIG. 11*b* gives a short description of the respective layers.

Samples has been tested with Electron-beam-induced current (EBIC) technique, which is a semiconductor analysis technique performed in a scanning electron microscope (SEM) or scanning transmission electron microscope (STEM). It is used to identify buried junctions or defects in semiconductors, or to examine minority carrier properties as known in prior art.

For example, in a solar cell, photons of light fall on the entire cell, thus delivering energy and creating electron hole pairs, and cause a current to flow. In EBIC, energetic electrons take the role of the photons, causing the EBIC current to flow.

With reference to Table 2 in FIG. 11*a*, samples have been investigated with a 10 kev beam. Kanaya and Okayama has developed the following equation for the depth of penetration of the beam.

The formula is:

$$R_{KO} = \frac{0.0276A}{Z^{0.89}\rho} E_0^{1.67}$$

wherein $R_{KO}$ is the electron range in μm, A is the atomic weight (g/mole), Z is the atomic number, ρ is the density ($g/cm^3$), and $E_0$ is the beam energy (keV).

Using this formula on the examples of layers in FIG. 11*a*, the electrons is calculated to penetrate 0.8 μm to 0.9 μm. This implies that the current mainly comes from the III-V layer.

According to an example of embodiment of the present invention, a method of providing controllable n-doping in a molecular beam epitaxy (MBE) growth process comprising growing group III-V materials on a (111)Si substrate, wherein a nucleation layer comprises group III-Sb material(s), comprises steps of:

growing the nucleation layer, thereafter directing a continually flowing arsenic flux towards the growth interface of the (111)Si substrate, depositing group III-V material(s) in steps comprising periods wherein in a first step the deposition of the group III-V material(s) is carried out, followed by a second step wherein the deposition of the group III-V material(s) is stopped, continuing depositing the group III-V material(s) according to the first step and the second step while the arsenic flux is continually flowing until the final material composition is grown, keeping the temperature of the epitaxial growth process in an interval between 300° C. to 580° C., wherein the deposited material is non-intentionally doped with a resulting p-type doping concentration in an interval of 2E14 $cm^{-3}$ to 3.6E16 $cm^{-3}$, and with a mobility 1.6E3 $cm^2/Vs$ at room temperature enabling compensation doping with a n-doping agent.

Further, the compensating n-dopant agent may be deposited simultaneously with the group III-V material(s) in the first step resulting in a n-doped material.

Further, the n-doping concentration may be in an interval from 16E17 $cm^{-3}$ to 3.5E18 $cm^{-3}$.

Further, the n-dopant agent may be from a group comprising silicon, sulfur, tellurium, tin, germanium, selenium.

Further, the arsenic flux source is provided by a solid As source with a temperature-controlled cracker in a range from 600° C. to 900° C.

Further, the arsenic flux concentration from the source is a mixture of $As_4$ and $As_2$.

Further, the concentration of $As_4$ is larger than the concentration of $As_4$ at a cracker temperature approaching 600° C., while the concentration of $As_4$ is less than the concentration of $As_2$ at a cracker temperature approaching 900° C.

Further, the arsenic flux concentration in non-nucleation layers, measured using beam equivalent pressure (BEP) is at least between 1.33322E-5 mbar (1.00E-05 T) to 3.99967E-5 mbar (3E-5 T), or above 3.99967E-5 mbar (3E-5 T).

Further, indium may be one of the group III-V materials being deposited in an amount from 1.1 at % to 21.4 at %.

Further, indium may be one of the group III-V materials being deposited in an amount according to one of the following amounts 1.1 at %, 1.2 at %, 1.4 at %, 2.2 at %, 2.4 at %, 2.6 at %, 2.9 at %, 3.3 at %, 3.9 at %, 4.2 at %, 4.6a t %, 5.6 at %, 7.1 at %, 8.3a t %, 10.0 at %, 14.3 at %, 16.7 at % or 21.4 at %.

Further, continuing the depositing of the group III-V material(s) according to the first step and the second step of the method according to the present invention may be done periodically.

Further, periods of growth stops may appear at randomised irregular intervals.

Further, a higher As flux concentration from the As source may enable shorter growth stops.

Further, periods with growth stops may be between 20 to 500 seconds long.

Further, the nucleation layer comprises As in an amount <20 at %.

Further, the (111)Si substrate may have a miscut angle providing steps on the (111)Si substrate surface, wherein heights of the respective steps are not more than one monolayer of molecules.

Further, the (111)Si substrate may be an on-cut crystal.

Further, the epitaxial growth process can be of a digital alloy growth type.

The invention claimed is:

1. A method of controlling n-doping in a molecular beam epitaxy (MBE) growth process that includes growing group III-arsenide materials comprising at least Ga and In or Al and In on a (111)Si substrate, wherein a nucleation layer comprises group III-Sb material(s), comprising the steps of:

(i) growing the nucleation layer, and thereafter (ii) directing a continually flowing arsenic flux from a source towards a growth interface of the (111)Si substrate, the arsenic flux concentration from the source being a mixture of $As_4$ and $As_2$, (iii) depositing group III-arsenide material(s) in steps comprising periods wherein in a first step the deposition of the group III-arsenide material(s) is carried out, followed by a second step wherein the deposition of the group III-arsenide material(s) is stopped, (iv) continuing depositing the group III-arsenide material (s) by performing the first step and the second step while the arsenic flux is continually flowing until a final material composition is grown, (v) keeping the temperature of the epitaxial growth process in an interval between 300° C. and 580° C., wherein the deposited material is non-intentionally doped with a resulting p-type doping concentration in an interval of $2\times10^{14}$ $cm^{-3}$ to $3.6\times10^{16}$ $cm^{-3}$, and with a Hall mobility greater than or equal to $1.6\times10^{3}$ $cm^{2}/Vs$ at room temperature, thereby enabling compensation doping with an n-doping agent, and the compensating n-dopant agent is deposited simultaneously with the group III-arsenide material(s) in the first step resulting in an n-doped material, having an n-dopant agent concentration of at least $1.00\times10^{16}$ $cm^{-3}$.

2. The method of claim 1, wherein the n-doping concentration is in an interval from $1\times10^{16}$ $cm^{-3}$ to $3.5\times10^{18}$ $cm^{-3}$.

3. The method of claim 1, wherein the n-dopant agent is from a group comprising silicon, sulfur, tellurium, tin, germanium, and selenium.

4. The method of claim 1, wherein an arsenic flux source is provided by a solid As source with a temperature-controlled cracker in a range from 600° C. to 900° C.

5. The method of claim 4, wherein the concentration of $As_4$ is larger than the concentration of $As_2$ at a cracker temperature approaching 600° C., while the concentration of $As_4$ is less than the concentration of $As_2$ at a cracker temperature approaching 900° C.

6. The method according to claim 1, wherein arsenic flux concentration in non-nucleation layers, measured using beam equivalent pressure (BEP) is at least $1.33322\times10^{-5}$ mbar.

7. The method according to claim 1, wherein the indium in the group III-arsenide material(s) is deposited in an amount from 1.1 at % to 21.4 at %.

8. The method of claim 1, wherein the indium in the group III-arsenide material(s) is deposited in an amount according to one of the following amounts 1.1 at %, 1.2 at %, 1.4 at %, 2.2 at %, 2.4 at %, 2.6 at %, 2.9 at %, 3.3 at %, 3.9 at %, 4.2 at %, 4.6 at %, 5.6 at %, 7.1 at %, 8.3 at %, 10.0 at %, 14.3 at %, 16.7 at % or 21.4 at %.

9. The method of claim 1, wherein continuing the depositing of the group III-arsenide material(s) according to the first step and the second step is done periodically.

10. The method of claim 1, wherein periods of growth stops appear at randomized irregular intervals.

11. The method of claim 1, wherein increasing arsenic flux concentration in non-nucleation layers, measured using beam equivalent pressure (BEP) to at least $1.33322\times10^{-5}$ mbar reduces growth stops duration.

12. The method of claim 9, wherein periods of growth stops are between 20 to 500 seconds long.

13. The method of claim 1, wherein the nucleation layer comprises As in an amount less than 20 at %.

14. The method of claim 1, wherein the (111)Si substrate has a miscut angle such that steps are provided on the (111)Si substrate surface, wherein heights of the respective steps are not more than one monolayer of molecules.

15. The method of claim 1, wherein the (111)Si substrate is an on-cut crystal.

16. The method of claim 1, wherein the epitaxial growth process is of a digital alloy growth type.

17. The method according to claim 6, wherein arsenic flux concentration in non-nucleation layers, measured using beam equivalent pressure (BEP), is within a range of $1.33322\times10^{-5}$ mbar to $3.99967\times10^{-5}$ mbar.

18. The method according to claim 6, wherein arsenic flux concentration in non-nucleation layers, measured using beam equivalent pressure (BEP), is above $3.99967\times10^{-5}$ mbar.

* * * * *